United States Patent
Hong et al.

(10) Patent No.: US 9,443,188 B2
(45) Date of Patent: Sep. 13, 2016

(54) OPERATION NUMBER-COUNTING PIEZOELECTRIC DISPENSER

(71) Applicant: PROTEC CO., LTD., Incheon (KR)

(72) Inventors: Seung Min Hong, Incheon (KR); Hansung Lee, Gyeonggi-Do (KR); Yong Hun Lee, Incheon (KR); Min Sun Kim, Incheon (KR)

(73) Assignee: PROTEC CO., LTD., Incheon (KR)

( * ) Notice: Subject to any disclaimer, the term of this patent is extended or adjusted under 35 U.S.C. 154(b) by 0 days.

(21) Appl. No.: 14/753,033

(22) Filed: Jun. 29, 2015

(65) Prior Publication Data

US 2015/0302292 A1 Oct. 22, 2015

Related U.S. Application Data

(63) Continuation of application No. PCT/KR2014/007471, filed on Aug. 12, 2014.

(30) Foreign Application Priority Data

Aug. 14, 2013 (KR) ........................ 10-2013-0096741

(51) Int. Cl.
| | |
|---|---|
| *B05B 17/00* | (2006.01) |
| *G06M 1/10* | (2006.01) |
| *F04B 17/03* | (2006.01) |
| *F04B 49/06* | (2006.01) |
| *F04B 17/00* | (2006.01) |
| *G07C 3/02* | (2006.01) |
| *H01L 21/56* | (2006.01) |
| *B05C 5/02* | (2006.01) |

(52) U.S. Cl.
CPC ............ *G06M 1/108* (2013.01); *B05C 5/0225* (2013.01); *F04B 17/003* (2013.01); *F04B 17/03* (2013.01); *F04B 49/06* (2013.01); *G07C 3/02* (2013.01); *H01L 21/563* (2013.01)

(58) Field of Classification Search
CPC ...................................... B05B 17/00
See application file for complete search history.

(56) References Cited

U.S. PATENT DOCUMENTS

| | | | |
|---|---|---|---|
| 6,404,837 B1 * | 6/2002 | Thompson | A47K 5/1208 377/13 |
| 6,542,568 B1 * | 4/2003 | Howes, Jr. | A47K 5/1217 377/16 |

FOREIGN PATENT DOCUMENTS

| | | |
|---|---|---|
| JP | 2009-106041 | 5/2009 |
| JP | 2013-097005 | 5/2013 |
| KR | 10-2005-0079557 | 8/2005 |
| KR | 10-1150139 | 6/2012 |

* cited by examiner

*Primary Examiner* — Hai L Nguyen
(74) *Attorney, Agent, or Firm* — Jianq Chyun IP Office

(57) ABSTRACT

Provided is an operating number-counting piezoelectric dispenser including a piezoelectric pump dispensing a liquid by using a piezoelectric element as an actuator. According to the operating number-counting piezoelectric dispenser, damages to a piezoelectric actuator may be predicted and the piezoelectric actuator may be replaced before the damages are caused, thereby preventing process loss and defective products and improving productivity.

9 Claims, 9 Drawing Sheets

OPERATION NUMBER-COUNTING PIEZOELECTRIC DISPENSER

CROSS-REFERENCE TO RELATED APPLICATIONS

This application is a Continuation of PCT International Application No. PCT/KR2014/007471 filed on Aug. 12, 2014, which claims priority under 35 U.S.C §119(a) to Korean Patent Application No. 10-2013-0096741, filed on Aug. 14, 2013. Each of the above application(s) is hereby expressly incorporated by reference, in its entirety, into the present application.

TECHNICAL FIELD

The inventive concept relates to an operation number-counting piezoelectric dispenser, and more particularly, to a dispenser including a piezoelectric pump dispensing a liquid by using a piezoelectric element as an actuator.

BACKGROUND ART

A dispenser supplying a predetermined amount of liquid that is in liquid form, such as water, oil, or resin is used in various fields such as in a semiconductor process or in the medical field.

Particularly in a semiconductor process, a dispenser is frequently used in an underfill process to fill a package of a semiconductor device with a resin. In a process of manufacturing a light emitting diode (LED) device, a dispenser is used in a process of coating a LED chip of the LED device with a phosphorescent liquid in which a phosphorescent material and a resin are mixed.

The dispenser as described above includes, as a core element, a pump that receives a liquid and dispenses a fixed amount of the liquid to an exact position.

Various pumps structures such as a screw pump or a linear pump are available. Recently, a piezoelectric pump that uses a piezoelectric element as an actuator has been developed and used in a semiconductor process or the like to perform a dispensing operation at a high speed.

KR 2005-0079557 (published on Aug. 10, 2005) discloses a piezoelectric pump structure comprising a plurality of piezoelectric actuators, on which a piezoelectric element is attached and which are sequentially operated in connection with one another at different displacement differences to pump a fluid.

A piezoelectric actuator used in a piezoelectric pump is usually formed of a ceramic material. When a ceramic piezoelectric actuator as described above is used for a long period time, fatigue destruction is generated. If fatigue destruction is generated in a piezoelectric actuator during an operation of dispensing a liquid to a semiconductor device by using a piezoelectric pump, the liquid may not be dispensed or a dispensing amount of the liquid may be not accurate and process defects may be caused.

Thus, a technique of predicting fatigue destruction of the piezoelectric actuator and effectively controlling the same is required.

DETAILED DESCRIPTION OF THE INVENTIVE CONCEPT

Technical Problem

The inventive concept provides an operation number-counting piezoelectric dispenser capable of predicting damages to a piezoelectric actuator before the damages are caused.

Technical Solution

According to an aspect of the inventive concept, there is provided an operation number-counting piezoelectric dispenser including: a pump body; a lever that is rotatably installed with respect to a hinge axis installed in the pump body; a piezoelectric actuator installed in the pump body and having a tip portion that is contactable to the lever as a length of the piezoelectric actuator is increased when a voltage is applied to the piezoelectric actuator to press and rotate the lever with respect to the hinge axis; a valve rod that is liftably connected to the lever according to rotation of the lever; a valve body including a storing unit, into which a tip portion of the valve rod is inserted and in which a liquid is stored, an inlet, through which the liquid flows into the storing unit, and a nozzle, through which the liquid of the storing unit is discharged according to advance and retreat of the valve rod with respect to the storing unit; an operation number storing unit that is installed in the pump body and stores an unique identification number of the pump body and the number of times that the piezoelectric actuator operates as a voltage is applied to the piezoelectric actuator; and a control unit that is electrically connected to the piezoelectric actuator and the operation number storing unit and applies a voltage to the piezoelectric actuator to operate the piezoelectric actuator, and calculates operating times of the piezoelectric actuator and stores the operating times in the operation number storing unit.

Advantageous Effects

According to the operation number-counting piezoelectric dispenser of the inventive concept, damages to a piezoelectric actuator may be predicted and the piezoelectric actuator may be replaced before the damages are caused, thereby preventing process loss and defective products and improving productivity.

BEST MODE

Hereinafter, an operation number-counting piezoelectric dispenser according to the inventive concept will be described more fully with reference to the accompanying drawings.

Figure 1:
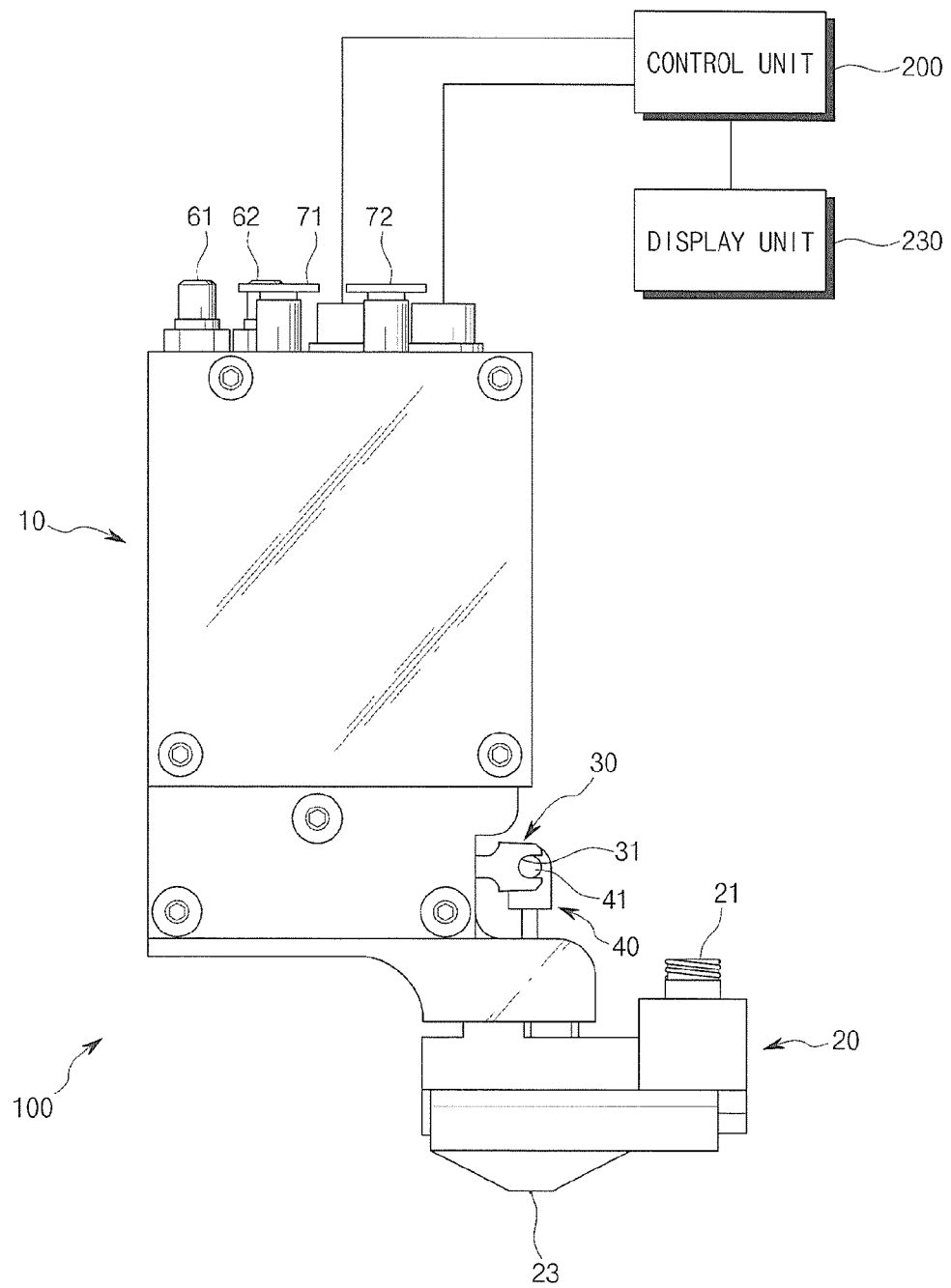
FIG. 1 is a front view of an operation number-counting piezoelectric dispenser according to an embodiment of the inventive concept.
Figure 2:
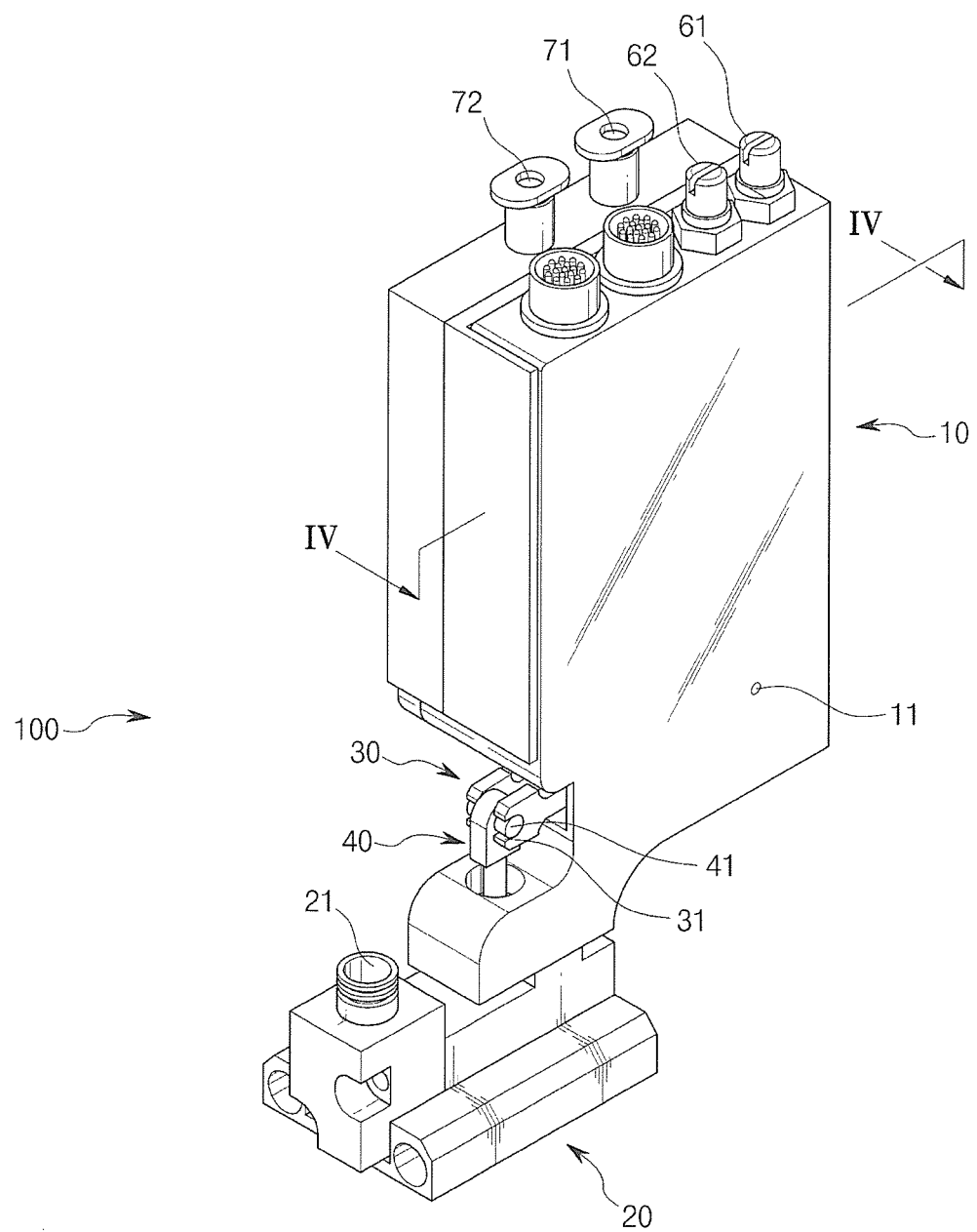
FIG. 2 is a perspective view of a piezoelectric pump of the operation number-counting piezoelectric dispenser illustrated in FIG. 1.
Figure 3:
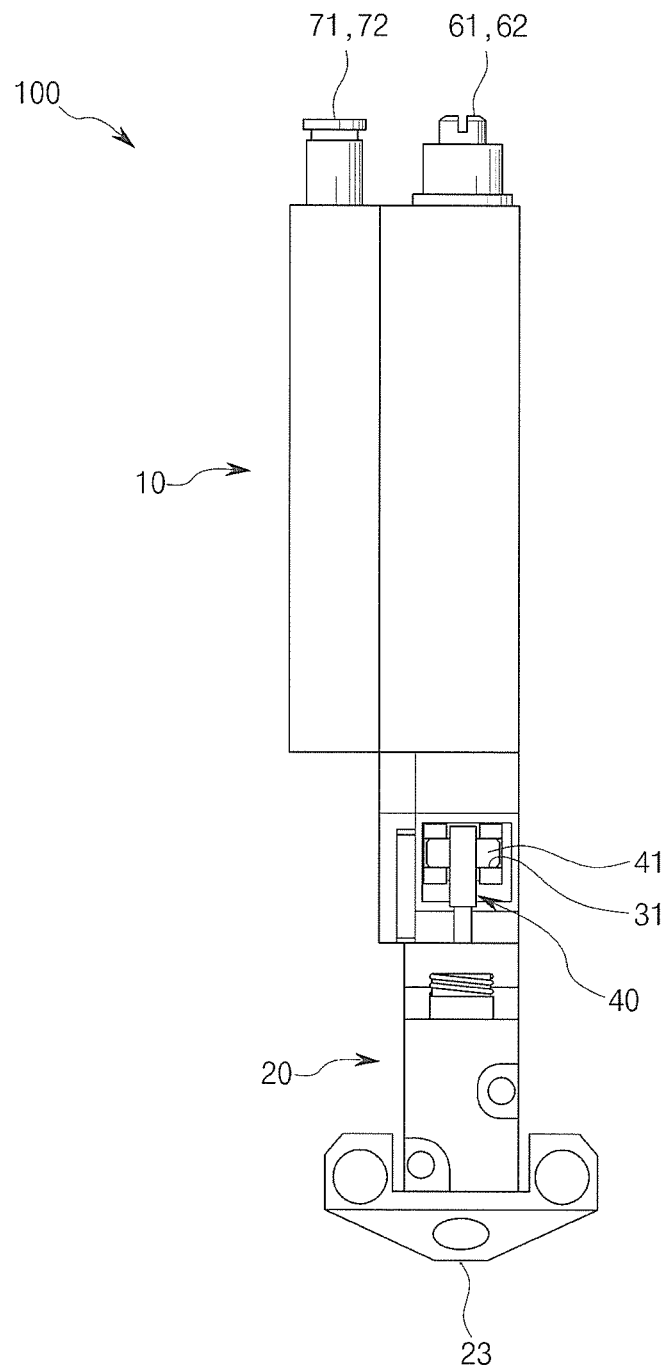
FIG. 3 is a side view of the operation number-counting piezoelectric dispenser illustrated in FIG. 2.

FIG. 1 is a front view of an operation number-counting piezoelectric dispenser according to an embodiment of the inventive concept. FIG. 2 is a perspective view of a piezoelectric pump of the operation number-counting piezoelectric dispenser illustrated in FIG. 1. FIG. 3 is a side view of the operation number-counting piezoelectric dispenser illustrated in FIG. 2.

Referring to FIGS. 1 through 3, the operation number-counting piezoelectric dispenser according to the present embodiment includes a piezoelectric pump 100 and a control unit 200. The piezoelectric pump 100 includes a pump body 10, a lever 30, piezoelectric actuators 51 and 52, a valve rod 40, a valve body 20, and an operation number storing unit 221.

The pump body 10 and the valve body 20 are detachably coupled to each other by using a bolt as illustrated in FIG. 1.

A hinge axis 11 is mounted in the pump body 10, and the lever 30 extending in a horizontal direction is rotatably installed with respect to the hinge axis 11.

The valve rod 40 extending in a vertical direction is inserted into the valve body 20. The lever 30 and the valve rod 40 are connected to each other, and when the lever 30 rotates with respect to the hinge axis 11, the valve rod 40 is lifted up or lowered down.

The piezoelectric actuators 51 and 52 are installed in the pump body 10. Two actuators 51 and 52 (a first piezoelectric actuator 51 and a second piezoelectric actuator 52) are included and rotate the lever 30 with respect to the hinge axis 11. The first piezoelectric actuator 51 and the second piezoelectric actuator 52 are formed of piezoelectric elements. That is, the first piezoelectric actuator 51 and the second piezoelectric actuator 52 are formed of piezoelectric elements whose length increases or decreases according to a potential of a voltage applied to the piezoelectric elements. Here, an embodiment will be described, in which multi-stack piezoelectric actuators 51 and 52 formed by stacking multiple piezoelectric elements are configured as the first piezoelectric actuator 51 and the second piezoelectric actuator 52.

Figure 4:
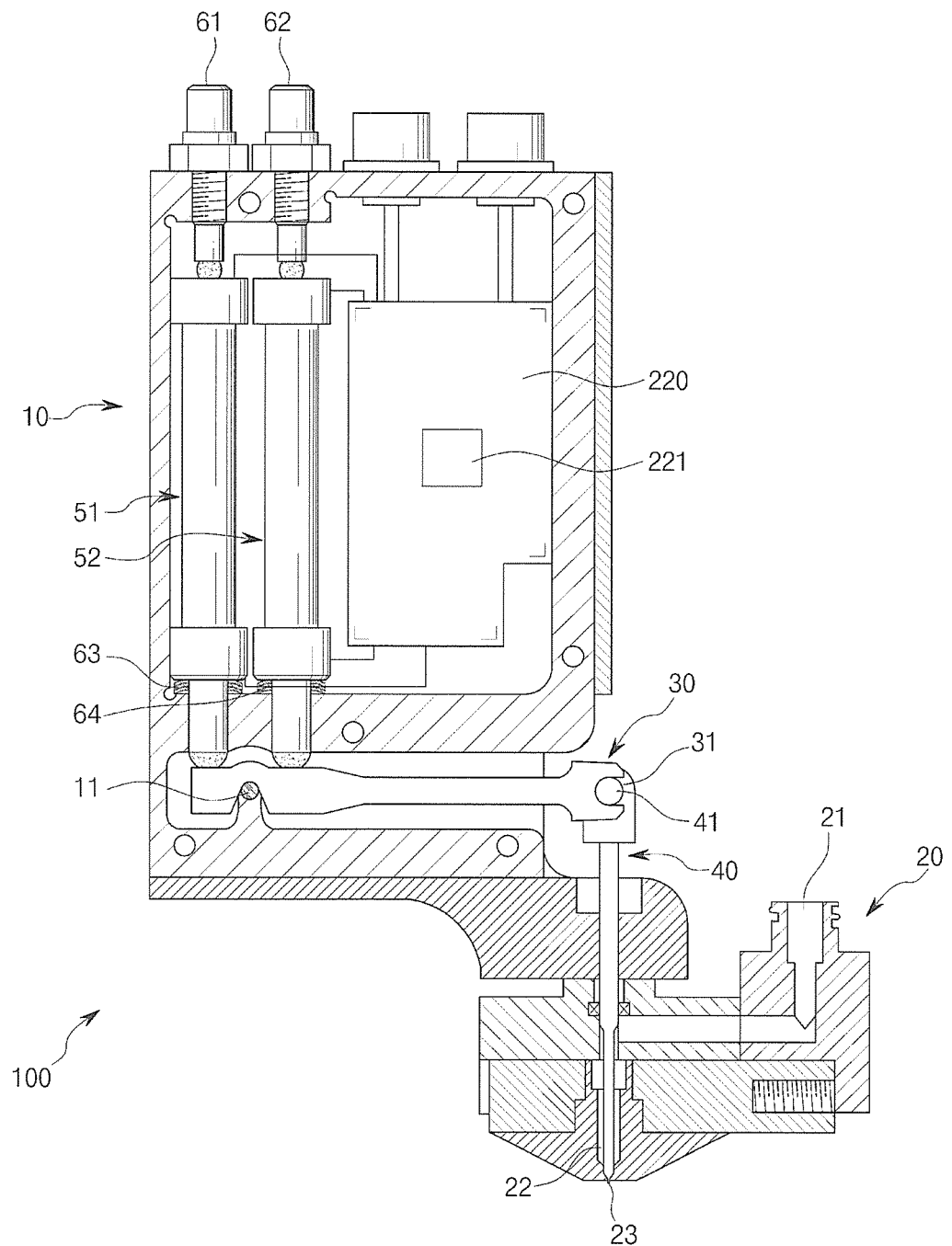
FIG. 4 is a cross-sectional view of the operation number-counting piezoelectric dispenser of FIG. 2 cut along a line IV-IV.
Figure 5:
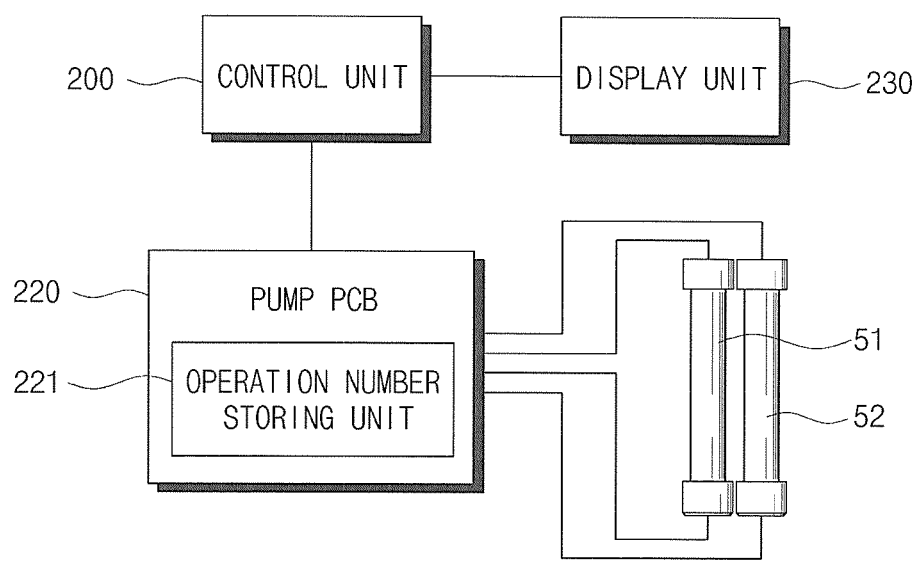
FIG. 5 is a block diagram illustrating major elements of the operation number-counting piezoelectric dispenser illustrated in FIG. 1.

As illustrated in FIG. 4, the first piezoelectric actuator 51 and the second piezoelectric actuator 52 arranged in parallel to each other in a vertical direction are installed in the pump body 10. The first piezoelectric actuator 51 and the second piezoelectric actuator 52 are disposed with the hinge axis 11 therebetween and such that lower end portions thereof respectively contact a top surface of the lever 30. When a voltage is applied to the first piezoelectric actuator 51 to increase a length of the first piezoelectric actuator 51, the lever 30 rotates counter-clockwise with respect to FIG. 4, and when a voltage is applied to the second piezoelectric actuator 52 to increase a length of the second piezoelectric actuator 52, the lever 30 rotates clockwise with respect to FIG. 4.

A first adjustment unit 61 and a second adjustment unit 2 that are respectively disposed on upper ends of the first piezoelectric actuator 51 and the second piezoelectric actuator 52 are installed in the pump body 10. In the present embodiment, the first adjustment unit 61 and the second adjustment unit 62 which are in the form of set screws are screw-coupled to the pump body 10 while respectively contacting tip portions of the first piezoelectric actuator 51 and the second piezoelectric actuator 52. The first adjustment unit 61 adjusts a position of the first piezoelectric actuator 51 with respect to the lever 30 and the pump body 10, and the second adjustment unit 62 adjusts a position of the second piezoelectric actuator 52 with respect to the lever 30 and the pump body 10. When the first adjustment unit 61 is tightened to move the first piezoelectric actuator 51 forward with respect to the pump body 10, the first piezoelectric actuator 51 may be lowered to be close to or in close contact with the lever 30. The second adjustment unit 62 is also operated in the same manner as the first adjustment unit 61.

A first returning unit 63 and a second returning unit 64 disposed respectively below the first piezoelectric actuator 51 and the second piezoelectric actuator 52 are installed in the pump body 10. The first returning unit 63 applies a force to the first piezoelectric actuator 51 in a direction in which the first piezoelectric actuator 51 is contracted. Likewise, the second returning unit 64 applies a force to the second piezoelectric actuator 52 in a direction in which the second piezoelectric actuator 52 is contracted. The first returning unit 63 and the second returning unit 64 may be springs that respectively provide an elastic force under the first piezoelectric actuator 51 and the second piezoelectric actuator 52 in a direction in which the first piezoelectric actuator 51 and the second piezoelectric actuator 52 are contracted, or may be fluid ducts. Here, an embodiment will be described, in which the first returning unit 63 and the second returning unit 64 are in the form of plate springs that are respectively below the first piezoelectric actuator 51 and the second piezoelectric actuator 52 and transmit an elastic force to the first piezoelectric actuator 51 and the second piezoelectric actuator 52. If a pneumatic pressure or a fluid pressure is used unlike the present embodiment, the first returning unit 63 and the second returning unit 64 allowing a pneumatic pressure or a fluid pressure to be transmitted to the lever 30 through a fluid duct to thereby transmit a force in a direction in which the lever 30 is returned to an original position, may be used.

The valve body 20 includes a storing unit 22, an inlet 21, and a nozzle 23. The storing unit 22 is in the form of a container having an opened top portion, and the valve rod 40 is inserted into the storing unit 22 so as to tightly close the top portion of the storing unit 22. The inlet 21 is connected to the storing unit 22. A liquid supplied from the outside is transferred to the storing unit 22 through the inlet 21.

The valve rod 40 connected to the lever 30 is lifted with respect to the storing unit 22 according to rotation of the lever 30. As the valve rod 40 is lifted and then lowered to approach the nozzle 23 disposed under the valve rod 40, the liquid inside the storing unit 22 is pressurized and is dispensed to the outside through the nozzle 23.

The lever 30 and the valve rod 40 may be connected using various methods. According to the present embodiment, the lever 30 and the valve rod 40 are connected to each other in a manner as illustrated in FIGS. 1 and 2. An engaging groove 31 that is opened in a horizontal direction is formed at a tip portion of the lever 30. That is, the engaging groove 31 of the lever 30 has a C-shape. An engaging rod 41 is formed on an upper end portion of the valve rod 40. The engaging rod 41 is inserted into the engaging groove 31 of the lever 30 to be rotatably connected to the lever 30. That is, rotation of the lever 30 may be converted to elevation of the valve rod 40. As the engaging groove 31 is formed to be opened in a horizontal direction, the engaging rod 41 may be moved in a horizontal direction with respect to the engaging groove 31 to thereby detach the engaging groove 31 and the engaging rod 41 from each other. As the engaging groove 31 is formed in a horizontal direction, even if the engaging groove 31 is lifted according to rotation of the lever 30, the engaging rod 41 is lifted or lowered with respect to the valve body 20 without being detached from the engaging groove 31. When the lever 30 and the valve rod 40 are to be separated from each other, they may be easily separated by moving the engaging rod 41 in a horizontal direction with respect to the engaging groove 31.

The operation number storing unit 221 is installed in the pump body 10. In the operation number storing unit 221, a unique identification number given to the pump body 10 and operating times of the piezoelectric actuators 51 and 52 that operated as a voltage is applied to the piezoelectric actuators 51 and 52 are stored. The operating times of the piezoelectric actuators 51 and 52 stored in the operation number storing unit 221 may be stored for every operation or every time when set operating times are reached. The operation number storing unit 221 is installed in the pump body 10 in the form of a PCB as illustrated in FIG. 4. A unique identification number is given to each operation number storing unit 221. As the number of times that the piezoelectric actuators 51 and 52 installed in the piezoelectric pump 100 are used is stored in the operation number storing unit 221 for each piezoelectric pump 100 together with an identification number of the piezoelectric pump 100, even when the piezoelectric pump 100 is replaced, the current operating times of the piezoelectric actuators 51 and 52 installed in the piezoelectric pump 100 may be easily detected.

The control unit 200 is connected to the piezoelectric actuators 51 and 52 via a pump PCB 220 that controls the piezoelectric actuators 51 and 52 in the piezoelectric pump 100. The operation number storing unit 221 is installed in the pump PCB 220 to receive a control signal of the control unit 200 and updates stored data according to a command of the control unit 200. The control unit 200 applies a voltage to the first and second piezoelectric actuators 51 and 52 via the pump PCB 220 so as to operate the piezoelectric actuators 51 and 52. The control unit 200 calculates operating times every time when a voltage is applied to the piezoelectric actuators 51 and 52. The control unit 200 may update and store operating times of the piezoelectric actuators 51 and 52 in the operation number storing unit 221 every time when a voltage is applied to the piezoelectric actuators 51 and 52, or may update data stored in the operation number storing unit 221 by adding operating times of the piezoelectric actuators 51 and 52 in the operation storing unit 221 for every predetermined number of times (for example, for every ten thousand times of operation).

When the operating times of the piezoelectric actuators 51 and 52 stored in the operation number storing unit 221 have reached a limit operation number, the control unit 200 notifies a user of the end of the operation number of the piezoelectric actuators 51 and 52 and necessity of replacement. According to the present embodiment, when the piezoelectric actuators 51 and 52 have operated up to a limit operation number which is preset to four trillion times, the control unit 200 displays on the display unit 230 a message notifying that replacement of the piezoelectric actuators 51 and 52 is necessary.

Also, the control unit 200 may display current operating times of the piezoelectric actuators 51 and 52 on the display unit 230 so that the user may detect how much of the operation number of the piezoelectric actuators 51 and 52 is left.

Cooling lines 71 and 72 are formed in the pump body 10 as illustrated in FIGS. 1 through 3. A cooling fluid flows to space around the piezoelectric actuators 51 and 52 through the cooling lines 71 and 72 to thereby cool the piezoelectric actuators 51 and 52. By allowing a gas or liquid of a relatively low temperature to flow through cooling paths as described above, heat generated in the first piezoelectric actuator 51 and the second piezoelectric actuator 52 is discharged to the outside.

Hereinafter, an operation of the operation number-counting piezoelectric dispenser according to the present embodiment configured as described above will be described.

Figure 6:
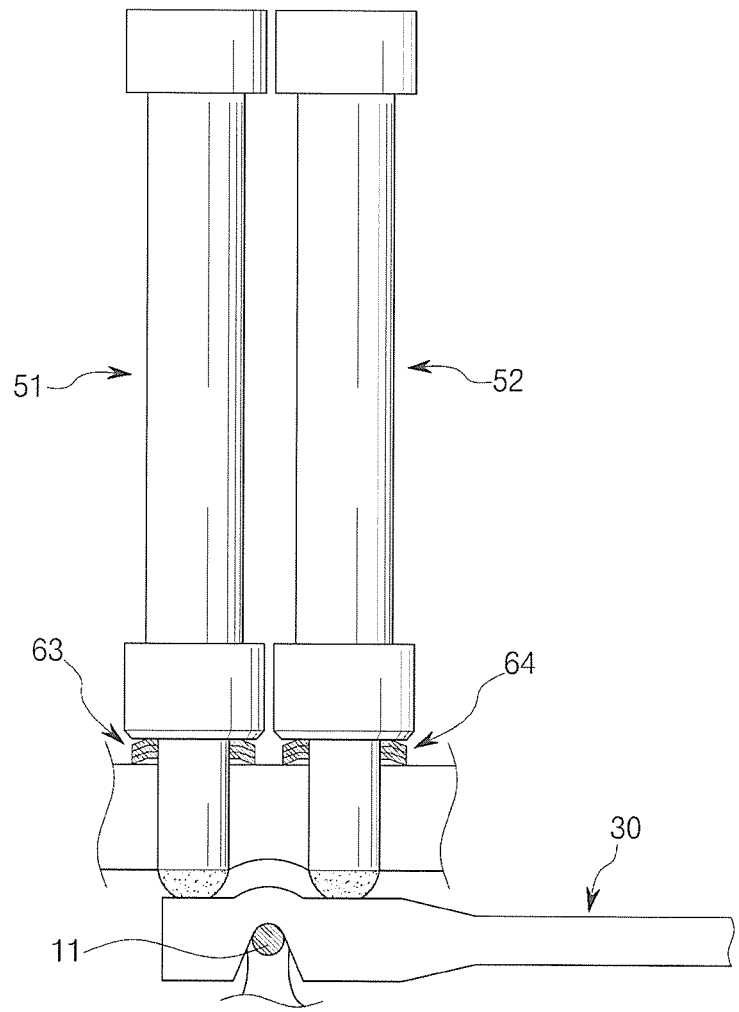
FIGS. 6 through 8 are schematic views for explaining an operation of the operation number-counting piezoelectric dispenser illustrated in FIG. 1.

First, while the pump body 10, the valve body 20, and the other elements are assembled as shown in FIG. 1, the control unit 200 applies a voltage to the first piezoelectric actuator 51 and the second piezoelectric actuator 52. A voltage of 50% with respect to a voltage that is to be applied to the second piezoelectric actuator 52 in order to lower the valve rod 40 to dispense a liquid through the nozzle 23 is applied to each of the first piezoelectric actuator 51 and the second piezoelectric actuator 52. As illustrated in FIG. 6, as the first piezoelectric actuator 51 and the second piezoelectric actuator 52 are extended by the same length, each of lower end portions thereof is in contact with the lever 30. In this state, the first adjustment unit 61 and the second adjustment unit 62 are respectively used to adjust positions of the first piezoelectric actuator 51 and the second piezoelectric actuator 52. The first piezoelectric actuator 51 and the second piezoelectric actuator 52 are respectively moved forward or backward by rotating bolts so that the lever 30 is in a horizontal state. Here, when the bolts are rotated to move the first piezoelectric actuator 51 or the second piezoelectric actuator 52 backward, the first returning unit 63 or the second returning unit 64 pressurizes the first piezoelectric actuator 51 or the second piezoelectric actuator 52 to contract the same.

Initial positions of the first piezoelectric actuator 51 and the second piezoelectric actuator 52 for dispensing are set in the above-described manner.

In this state, a liquid is supplied to the storing unit 22 through the inlet 21 at a predetermined pressure.

Next, a dispensing process of the liquid is started.

Figure 7:
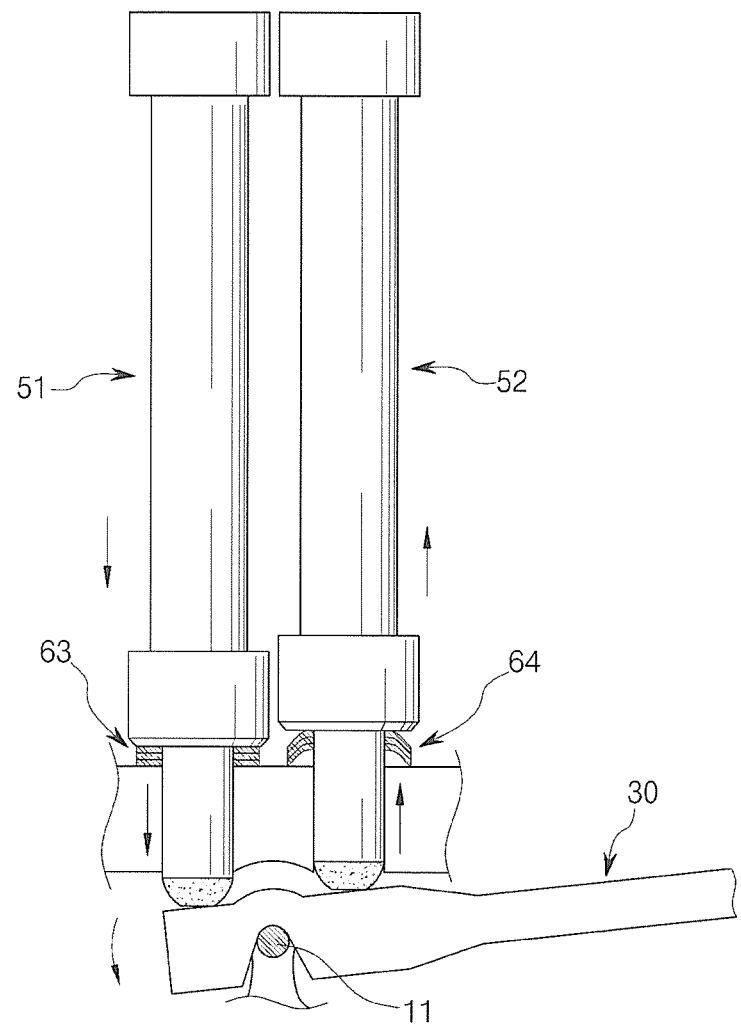

When a voltage of 100% is applied to the first piezoelectric actuator 51, and a voltage of 0% is applied to the second piezoelectric actuator 52, the first piezoelectric actuator 51 is expanded, and the second piezoelectric actuator 52 is contracted. As illustrated in FIG. 7, as the lever 30 rotates counter-clockwise, the valve rod 40 is lifted. Here, due to an operation of the second returning unit 64, rotation of the second piezoelectric actuator 52 is faster. For reference, expansion and contraction of the piezoelectric actuators 51 and 52 and an inclination angle of the lever 30 are exaggerated in FIG. 7 for effective description.

Figure 8:
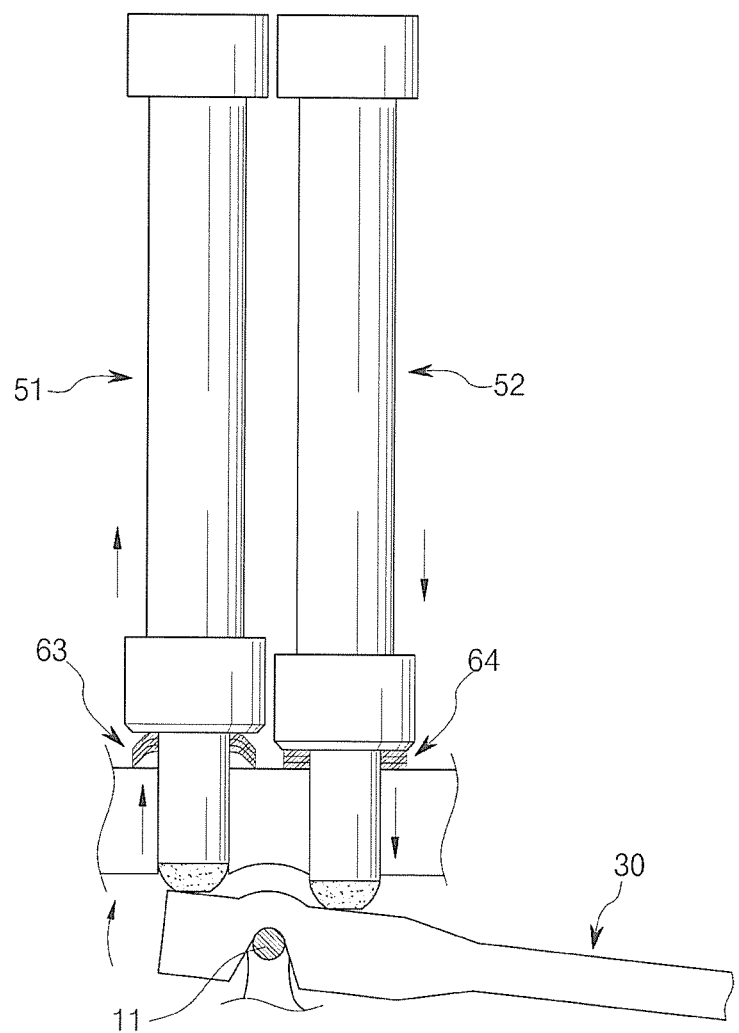

In this state, when a voltage of 0% is applied to the first piezoelectric actuator 51, and a voltage of 100% is applied to the second piezoelectric actuator 52, the first piezoelectric actuator 51 is contracted, and the second piezoelectric actuator 52 is expanded. As illustrated in FIG. 8, as the lever 30 rotates clockwise, the valve rod 40 is lowered. As the valve rod 40 inserted into the storing unit 22 is lowered, the valve rod 40 pressurizes the liquid in the storing unit 22 to discharge the liquid to the outside through the nozzle 23, thereby dispensing the liquid. Here also, the first returning unit 63 contracts the first piezoelectric actuator 51 to help the lever 30 rotate quickly in a clockwise direction. Like FIG. 7, an inclination angle of the lever 30 is exaggerated in FIG. 8 for effective description.

By alternately applying a voltage to the first piezoelectric actuator 51 and the second piezoelectric actuator 52 as described above, the valve rod 40 is repeatedly lifted as illustrated in FIGS. 7 and 8, thereby continuously dispensing the liquid through the nozzle 23.

As illustrated in FIG. 6, a distance between a rotational axis and the valve rod 40 is far greater than a distance between the rotational axis and the first piezoelectric actuator 51 and the second piezoelectric actuator 52, and thus, a deformation amount of the piezoelectric actuators 51 and 52 may be sufficiently extended by using the lever 30 so as to operate the valve rod 40 within a sufficient height range.

The control unit 200 controlling operations of the first piezoelectric actuator 51 and the second piezoelectric actuator 52 may apply a voltage having various pulse waveforms to the first piezoelectric actuator 51 and the second piezoelectric actuator 52 according to time to thereby control dynamic characteristics of the valve rod 40. In particular, by disposing the two piezoelectric actuators 51 and 52 with the hinge axis 11 included therebetween and configuring the two piezoelectric actuators 51 and 52 to respectively operate the lever 30, not only descending movement but also elevation of the valve rod 40 may be controlled, and accordingly, the liquid may be quickly dispensed, and an amount of the dispensed liquid may also be accurately controlled.

In particular, mechanical operating characteristics of the first piezoelectric actuator 51 and the second piezoelectric actuator 52 may be accurately controlled by the control unit 200 by using an electrical method based on factors such as amplitude of a voltage to be applied, an alternating frequency of a voltage, or a deformation amount of a voltage according to time. Improvement of controlling performance with respect to an operation of the valve rod 40 as above allows easy and accurate controlling of dispensing characteristics of the dispensed liquid.

Due to characteristics of the piezoelectric actuators 51 and 52, a relatively large amount of heat is generated in the piezoelectric actuators 51 and 52 during use thereof. When a temperature of the piezoelectric actuators 51 and 52 is increased due to heat generated in the piezoelectric actuators 51 and 52, operating characteristics thereof may be degraded. In the operation number-counting piezoelectric dispenser according to the present embodiment, the cooling lines 71 and 72 are formed in the pump body 10 as shown in FIGS. 1 through 4. By cooling the pump body 10 through the cooling lines 71 and 72 via space of the piezoelectric actuators 51 and 52, an increase in temperature of the piezoelectric actuators 51 and 52 may be prevented. By preventing an increase in temperature of the piezoelectric actuators 51 and 52, dynamic characteristics of the valve rod 40 may be maintained uniform and dispensing quality of the liquid may be maintained.

According to the operation number-counting piezoelectric dispenser according to the present embodiment, as the pump body 10 and the valve body 20 are detachably configured and the lever 30 and the valve rod 40 are configured to be easily connected and separated to and from each other, maintenance and cleaning are easy and the piezoelectric pump 100 may be easily configured to correspond to various characteristics of a liquid. The valve body 20 and the valve rod 40 may be easily separated from the pump body 10 by loosening a screw coupling the pump body 10 and the valve body 20 and detaching the engaging rod 41 of the valve rod 40 from the engaging groove 31 of the lever 30.

When the valve body 20 is separated, it is easy to clean for next use. Even when the valve body 20 or the valve rod 40 is damaged, the valve body 20 or the valve rod 40 may be separated by using the above-described method and a new valve body 20 or a new valve rod 40 may be replaced.

When a type of a liquid to be dispensed is changed, the piezoelectric pump 100 may be configured by replacing with another valve body 20 and another valve rod that are designed in consideration of a viscosity or other characteristics of the changed liquid.

The piezoelectric actuators 51 and 52 are typically formed of a ceramic material. When the piezoelectric actuators 51 and 52 are used for a long period of time, expansion displacement thereof according to an applied voltage may be changed from the initial expansion displacement due to the characteristics of the ceramic material. Also in this case, the piezoelectric pump 100 according to the present embodiment may maintain dynamic characteristics of the lever 30 and the valve rod 40 by adjusting positions of the first piezoelectric actuator 51 and the second piezoelectric actuator 52 by using the first adjustment unit 61 and the second adjustment unit 62.

As described above, while the piezoelectric pump 100 is operating, the control unit 200 updates operating times of the piezoelectric actuators 51 and 52 and stores the same in the operation number storing unit 221. In particular, when a plurality of piezoelectric pumps 100 are installed in the operation number-counting piezoelectric dispenser to be used, the respective piezoelectric pumps 100 may be distinguished based on respective identification numbers given to the respective piezoelectric pumps 100 when storing operating times of the piezoelectric actuators 51 and 52 installed in the piezoelectric pumps 100 in the operation number storing unit 221. In particular, also when the piezoelectric pump 100 is replaced in the operation number-counting piezoelectric dispenser, the control unit 200 reads identification numbers and operating times of the piezoelectric actuators 51 and 52 stored in the operating number calculating unit 221 to set an initial value and then adds subsequent operating times to the initial value to store the operating times in the operating number storing unit 221. Accordingly, the operating times of the piezoelectric actuators 51 and 52 are stored and controlled in the piezoelectric pump 100, and thus, the operation numbers of the piezoelectric pump 100 or the piezoelectric actuators 51 and 52 may be effectively controlled.

Also, as described above, the control unit 200 may display operating times of the piezoelectric actuators 51 and 52 of each piezoelectric pump 100 on the display unit 230 so that a user may check a current state. When the operating times of the piezoelectric actuators 51 and 52 exceed limit operating times, the control unit 200 displays a message notifying that the piezoelectric actuators 51 and 52 need to be replaced, on the display unit 230. According to this method, the piezoelectric actuators 51 and 52 may be replaced by predicting damages to the piezoelectric actuators 51 and 52 before the damages are caused.

By allowing to replace the piezoelectric actuators 51 and 52 in advance as described above, defects of a product to which a liquid is to be dispensed may be prevented. When a liquid is not dispensed due to damages to the piezoelectric actuators 51 and 52 or when a dispensing amount of a liquid is not accurate, all products to which the liquid is dispensed are defective and may have to be discarded. In this case, financial loss that is higher than the price of the piezoelectric actuators 51 and 52 may be caused. However, according to the present inventive concept, damages to the piezoelectric actuators 51 and 52 may be predicted in advance so as to replace the piezoelectric actuators 51 and 52 or the piezoelectric pump 100, thereby preventing process loss or defective products and improving productivity.

MODE OF THE INVENTIVE CONCEPT

While the inventive concept has been particularly shown and described with reference to exemplary embodiments thereof, the scope of the inventive concept is not limited to the forms described and illustrated above.

For example, while the first returning unit 63 and the second returning unit 64 that are formed of springs or implemented using a pneumatic pressure are described above, according to circumstances, a liquid pressure may be used to implement a first returning unit and a second returning unit. Also, a pump that does not include the first returning unit 63 and the second returning unit 64 may be included.

Also, the display unit 230 may include a buzzer and generate an alarming sound to notify in a case when the piezoelectric actuators 51 and 52 have operated set limited operating times or more.

Also, a pump including the pump body 10 without cooling lines 71 and 72 may also be implemented.

Also, while the lever 30 and the valve rod 40 are described as being connected via the engaging groove 31 of the lever 30 and the engaging rod 41 of the valve rod 40, a lever and a valve rod may also be connected by using other methods. A pump body and a valve body may not be detachably coupled to each other but may be formed as a single unit.

Figure 9:
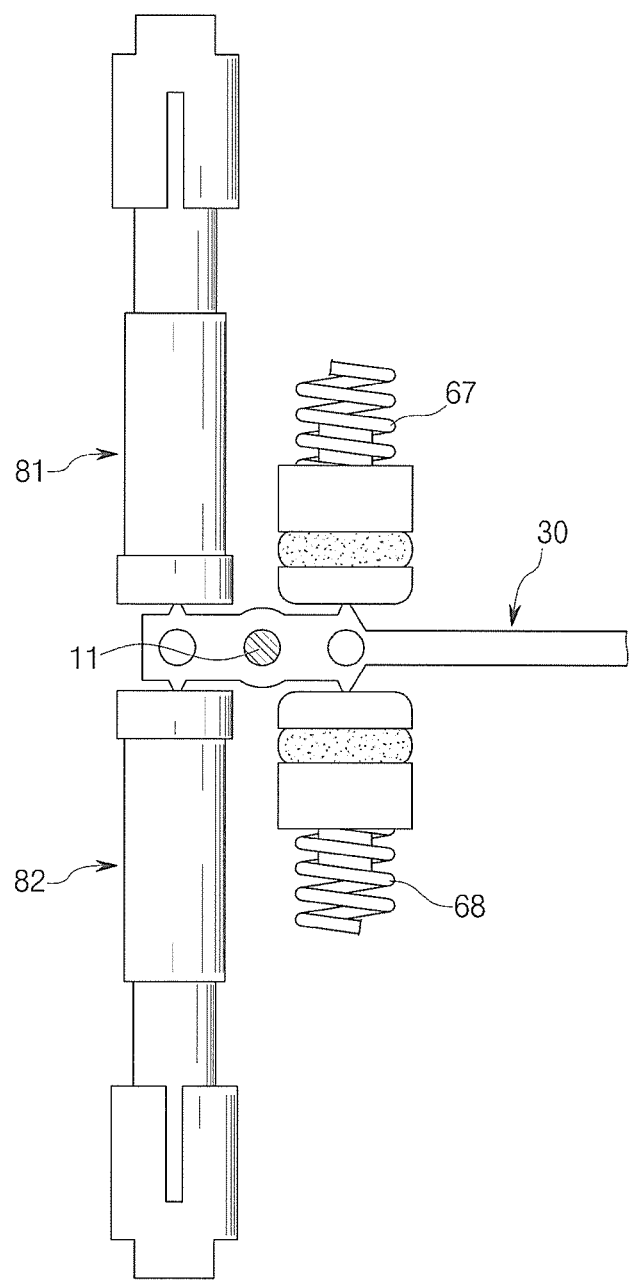
FIG. 9 is a schematic view for explaining an operation of the operation number-counting piezoelectric dispenser according to another embodiment of the inventive concept.

Hereinafter, an operation number-counting piezoelectric dispenser according to another embodiment of the inventive concept will be described with reference to FIG. 9.

Unlike the piezoelectric pump 100 of the operation number-counting piezoelectric dispenser described above with reference to FIGS. 1 through 8, according to the operation number-counting piezoelectric dispenser according to the present embodiment, a first piezoelectric actuator 81 and a second piezoelectric actuator 82 are disposed to face each other in a straight line, with the lever 30 therebetween. When a voltage is applied to the first piezoelectric actuator 81, and no voltage is applied to the second piezoelectric actuator 82, the lever 30 rotates counter-clockwise to lift the valve rod 40. When no voltage is applied to the first piezoelectric actuator 81, and a voltage is applied to the second piezoelectric actuator 82, the lever 30 rotates clockwise to lower the valve rod 40, and a liquid is dispensed through the nozzle 23. A first returning unit 67 and a second returning unit 68 are also disposed to face each other in a straight line, with the lever 30 therebetween. The first returning unit 67 provides an elastic force in a direction in which the first piezoelectric actuator 81 is contracted, and the second returning unit 68 provides an elastic force in a direction in which the second piezoelectric actuator 82 is contracted.

In regard to other elements except for arrangement of the first piezoelectric actuator 81 and the second piezoelectric actuator 82, a pump may be configured by appropriately modifying the other elements of the embodiments described with reference to FIGS. 1 through 8 above. However, in the pump according to the present embodiment, the first returning unit 63 and the second returning unit 64 may be unnecessary.

The invention claimed is:

1. An operation number-counting piezoelectric dispenser comprising:
   a pump body;
   a lever that is rotatably installed with respect to a hinge axis installed in the pump body;
   a piezoelectric actuator installed in the pump body and having a tip portion that is contactable to the lever as a length of the piezoelectric actuator is increased when a voltage is applied to the piezoelectric actuator to press and rotate the lever with respect to the hinge axis;
   a valve rod that is liftably connected to the lever according to rotation of the lever;
   a valve body comprising a storing unit, into which a tip portion of the valve rod is inserted and in which a liquid is stored, an inlet, through which the liquid flows into the storing unit, and a nozzle, through which the liquid of the storing unit is discharged according to advance and retreat of the valve rod with respect to the storing unit;
   an operation number storing unit that is installed in the pump body and stores an unique identification number of the pump body and the number of times that the piezoelectric actuator operates as a voltage is applied to the piezoelectric actuator; and
   a control unit that is electrically connected to the piezoelectric actuator and the operation number storing unit and applies a voltage to the piezoelectric actuator to operate the piezoelectric actuator, and calculates operating times of the piezoelectric actuator and stores the operating times in the operation number storing unit.

2. The operation number-counting piezoelectric dispenser of claim 1, further comprising a display unit displaying an operational condition of the piezoelectric actuator according to the control unit,
   wherein the control unit displays operating times of the piezoelectric actuator on the display unit.

3. The operation number-counting piezoelectric dispenser of claim 2, wherein the control unit displays on the display unit a message notifying that the piezoelectric actuator needs to be replaced when the piezoelectric actuator has operated preset operating times or more.

4. The operation number-counting piezoelectric dispenser of claim 1, wherein a first piezoelectric actuator and a second piezoelectric actuator are included,
   wherein the first piezoelectric actuator and the second piezoelectric actuator are installed in the pump body to rotate the lever with respect to the hinge axis in opposite directions from each other when a voltage is applied to the first piezoelectric actuator and the second piezoelectric actuator by the control unit.

5. The operation number-counting piezoelectric dispenser of claim 4, wherein the first piezoelectric actuator and the second piezoelectric actuator are disposed in parallel to each other, with the hinge axis of the pump body included therebetween.

6. The operation number-counting piezoelectric dispenser of claim 4, wherein the first piezoelectric actuator and the second piezoelectric actuator are disposed to face each other, with the lever included therebetween.

7. The operation number-counting piezoelectric dispenser of claim 4, further comprising:
   a first returning unit for applying a force to the first piezoelectric actuator in a direction in which the first piezoelectric actuator is contracted; and
   a second returning unit for applying a force to the second piezoelectric actuator in a direction in which the second piezoelectric actuator is contracted.

8. The operation number-counting piezoelectric dispenser of claim 7, wherein the first returning unit and the second returning unit are springs that are installed in the pump body and apply an elastic force to the lever.

9. The operation number-counting piezoelectric dispenser of claim 4, wherein a cooling line, through which a cooling fluid for cooling heat generated in the first piezoelectric actuator and the second piezoelectric actuator flows, is formed in the pump body.

* * * * *